United States Patent
Shen et al.

(10) Patent No.: US 9,978,499 B2
(45) Date of Patent: May 22, 2018

(54) METHODS FOR MANUFACTURING INTEGRATED MAGNETIC COMPONENTS AND LED POWER SUPPLY

(71) Applicant: ZHEJIANG SHENGHUI LIGHTING CO., LTD, Jiaxing (CN)

(72) Inventors: Jinxiang Shen, Jiaxing (CN); Ningning Wang, Jiaxing (CN)

(73) Assignee: ZHEJIANG SHENGHUI LIGHTING CO., LTD., Jiaxing (CN)

( * ) Notice: Subject to any disclaimer, the term of this patent is extended or adjusted under 35 U.S.C. 154(b) by 0 days. days.

(21) Appl. No.: 14/421,187

(22) PCT Filed: Nov. 7, 2014

(86) PCT No.: PCT/CN2014/090541
§ 371 (c)(1),
(2) Date: Feb. 12, 2015

(87) PCT Pub. No.: WO2015/067205
PCT Pub. Date: May 14, 2015

(65) Prior Publication Data
US 2016/0042856 A1 Feb. 11, 2016

(30) Foreign Application Priority Data
Nov. 7, 2013 (CN) .......................... 2013 1 0548322

(51) Int. Cl.
*H01F 5/00* (2006.01)
*H01F 27/28* (2006.01)
(Continued)

(52) U.S. Cl.
CPC ............. *H01F 27/25* (2013.01); *G01R 15/20* (2013.01); *H01F 27/2804* (2013.01);
(Continued)

(58) Field of Classification Search
CPC ... H01F 27/25; H01F 27/2895; H01F 41/0213
(Continued)

(56) References Cited

U.S. PATENT DOCUMENTS

| | | | |
|---|---|---|---|
| 6,990,729 B2 * | 1/2006 | Pleskach | H01F 17/0033 156/250 |
| 2002/0002771 A1 * | 1/2002 | Lin | H01F 17/0033 29/602.1 |

(Continued)

*Primary Examiner* — Ronald Hinson
(74) *Attorney, Agent, or Firm* — Anova Law Group, PLLC

(57) ABSTRACT

The present disclosure provides an integrated magnetic component, a method for manufacturing the integrated magnetic component, and an integrated LED power supply including the magnetic component. The integrated magnetic component includes a PCB baseboard, wherein magnetic core, copper coils and pins are embedded in the baseboard. The magnetic core may be an iron or cobalt-based soft magnetic thin film(s), and it may be stuck or coated on the inner layer of the PCB baseboard. Further, the copper coil may be thin copper tracks. The present disclosure provides a method for making iron or cobalt-based nanocrystalline strip(s) using a soft magnetic thin film deposition method, or a melt spinning method. The iron or cobalt-based soft magnetic thin film(s) may then be used to make an embedded PCB magnetic core. The resulting magnetic component is thin, highly efficient, and functions as a substrate in the assembly process. In addition, the LED power supply consistent with the present disclosure is thin and small, highly integrated, with process repeatability and reliability. Embodiments consistent with the present disclosure thus simplify the system assembly process for making LED power supplies, and save time and cost in the process.

3 Claims, 2 Drawing Sheets

(51) Int. Cl.
  *G11B 5/127* (2006.01)
  *H01F 27/25* (2006.01)
  *H05K 1/16* (2006.01)
  *G01R 15/20* (2006.01)
  *H01F 41/02* (2006.01)
  *H05K 3/30* (2006.01)
  *H01F 1/153* (2006.01)

(52) U.S. Cl.
  CPC ......... *H01F 41/0213* (2013.01); *H05K 1/165* (2013.01); *H05K 3/30* (2013.01); *H01F 1/15333* (2013.01); *H01F 27/2895* (2013.01); *H05K 2201/083* (2013.01)

(58) Field of Classification Search
  USPC .......................................................... 336/29
  See application file for complete search history.

(56) References Cited

U.S. PATENT DOCUMENTS

| | | | | |
|---|---|---|---|---|
| 2005/0237146 A1* | 10/2005 | Hirzel | ..................... | H01F 27/25 336/212 |
| 2007/0069961 A1* | 3/2007 | Akiho | ................. | H01Q 21/0025 343/702 |
| 2009/0015364 A1* | 1/2009 | Whittaker | ........... | H01F 17/0033 336/229 |

* cited by examiner

METHODS FOR MANUFACTURING INTEGRATED MAGNETIC COMPONENTS AND LED POWER SUPPLY

CROSS-REFERENCES TO RELATED APPLICATIONS

This application claims the priority of Chinese Patent Application No. 201310548322.5 filed on Nov. 7, 2013, the entire contents of which is incorporated herein by reference.

FIELD OF THE DISCLOSURE

The present disclosure relates to the field of magnetic component manufacturing, and more particularly, to manufacturing integrated magnetic components based on PCB (Printed Circuit Board) designs, a method for manufacturing magnetic components, and an integrated LED power supply made from magnetic components.

BACKGROUND

A magnetic component often includes a winding and a magnetic core. Magnetic components are essential power electronic components used in various applications including energy storage, energy conversion, and electrical isolation applications. They are necessary for a large number of power supply circuits. As such, magnetic components are some of the most important components in the field of power electronics technologies.

Magnetic components mainly fall into two general categories: transformers and inductors. For instance, in an LED power supply, the necessary magnetic components may include a transformer, a common mode inductor, and a power inductor, etc. The LED power supplies require high quality magnetic components in comparison to conventional power supplies. For example, LED lights have relatively high working temperatures. The LED power supplies require the magnetic components used, such as transformers and inductors, to be small, reliable, stable, and with little power loss. In order to meet these requirements, it is important to optimize the magnetic core used in the LED power supplies to improve the power density and other characteristics of the components.

PCB integrated magnetic components can be divided into two categories: the coreless PCB components and the PCB components with a core. A coreless PCB transformer is often used in power circuits such as a power switch. Because it has relatively low power, in order to achieve high inductance, a coreless PCB transformer requires a larger number of winding turns. However, more winding turns would increase the resistance, and affect the efficiency of the component. Thus, in power PCB magnetic components, magnetic core is widely used to increase the induction density. For example, many of the state-of-the-art PCB magnetic components use ferrite magnetic materials for the core. Because ferrite magnetic materials have low permeability and magnetic induction density at operating points, using ferrite magnetic materials may not fully realize the advantages of the PCB magnetic components such as the small size and high power density.

With the development of magnetic material technologies, various magnetic materials appear to have better characteristics. For example, a magnetic thin film is a material with valuable characteristics such as high saturation magnetic flux density, low coercivity, high resistivity, and so on. The thin film material is often used for integrating inductor onto silicon chips. However, because of the limitations of the micro-fabrication technologies, the deposition method for manufacturing thin film materials is limited to micro-fabrication techniques, such as electroplating and sputtering methods. The electroplating method may manufacture materials with relatively low resistivity, but the thickness of usable magnetic material part may be very limited because of the "skin effect." On the other hand, the sputtering method may manufacture materials not affected by resistivity, but the deposition process may be slow and costly.

The disclosed method and system are directed to solve one or more problems set forth above and other problems.

BRIEF SUMMARY OF THE DISCLOSURE

Embodiments consistent with the present disclosure provide an integrated magnetic component, which is thin, highly efficient, and functions as a substrate in the assembly process.

One aspect of the present disclosure provides an integrated magnetic component for an LED power supply circuit, comprising a PCB baseboard, a magnetic core, copper coils and pins. Further, the magnetic core, the copper coils and the pins are embedded in the PCB baseboard or built onto the outer layer of PCB baseboard; the magnetic core is an Iron or cobalt-based soft magnetic thin film(s) on the inner or outer layer of the PCB baseboard; and the copper coil is formed by thin copper tracks. The integrated magnetic component may be an inductor, a transformer, or a sensor. The integrated magnetic component is the substrate of the LED power supply circuit. In addition, other components for a power supply are assembled onto the integrated magnetic component, using the integrated magnetic component as a substrate.

Another aspect of the present disclosure provides a method for manufacturing an integrated magnetic component for an LED power supply circuit. The method includes cutting a material of a PCB baseboard into a size of the integrated magnetic component; generating an iron or cobalt-based soft magnetic thin film(s) using a soft magnetic thin film deposition method or a melt spinning method; and attaching the soft magnetic thin film(s) on the inner or outer layer of the PCB base board to form a magnetic core. The method further includes formulating a pattern(s) on the magnetic core, using either a dry etching or a wet itching method; drilling holes on the PCB baseboard to connect different layers; inter-connecting an inner and outer PCB baseboard layer; depositing a layer of copper on an inner side of the holes; and plating and etching the PCB.

The method for manufacturing the integrated magnetic component for an LED power supply circuit further includes assembling other components for the power supply circuit onto the integrated magnetic component using the integrated magnetic component as a substrate.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts.

Iron or cobalt nanocrystalline materials are used in exemplary embodiments for illustration purpose only. Embodiments consistent with the present disclosure are not limited to the use of iron or cobalt-based nanocrystalline materials. Other types of thin film soft magnetic materials deposited using various approaches, such as electroplating, cold/hot pressing, etc., also can be used. It is apparent that the described embodiments are some but not all of the embodiments of the present invention. Based on the disclosed embodiment, persons of ordinary skill in the art may derive other embodiments consistent with the present disclosure, all of which are within the scope of the present invention.

There are few technical limitations in selecting magnetic materials for PCB magnetic components. In recent years, technologies related to iron or cobalt-based nanocrystalline materials have made significant advancements. These materials may be better options for magnetic cores. For example, the Finemet type nanocrystalline soft magnetic alloy is an exemplary iron-based nanocrystalline material for this usage. Its ingredient may be, for example, Fe73.5Cu1Nb3Si13.5B9. The performance parameter may be, for example, Bs=1.24 T, Hc=0.53 A/m, μr(1 kHz)=1.0× $10^5$. In addition, the manufacturing process of the iron or cobalt-based nanocrystalline materials is straightforward. The materials have valuable soft magnetic material characteristics, such as high saturation magnetic flux densities, high resistivity, low coercivity, etc.

Embodiments consistent with the present disclosure use a soft magnetic thin film deposition method or a melt spinning method to generate an iron or cobalt-based nanocrystalline strip(s). Embodiments consistent with the present disclosure then use the strip(s) to produce embedded PCB magnetic core through a PCB manufacturing process. Moreover, through selecting suitable materials and technical designs, and analyzing the characteristics of the materials, embodiments consistent with the present disclosure use the mathematical model of this magnetic component. As a result, embodiments consistent with the present disclosure provide high performance and highly integrated magnetic components.

Figure 1:
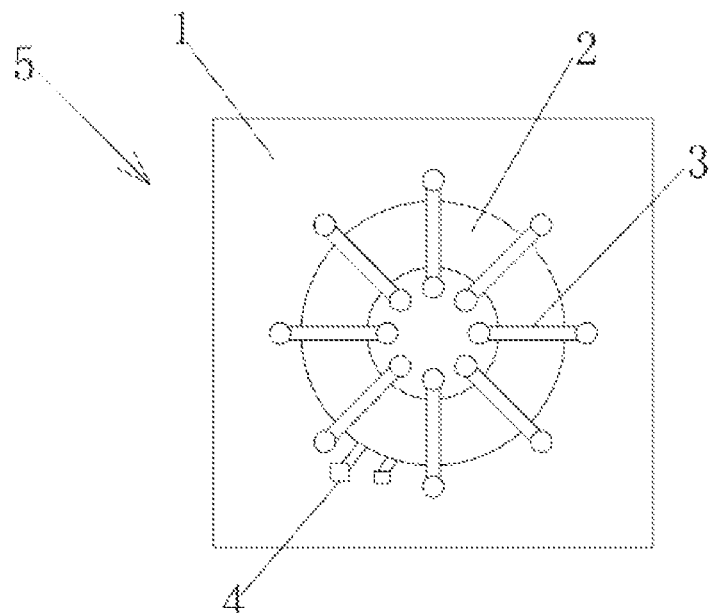
FIG. 1 is a block diagram illustrating an exemplary integrated magnetic component manufactured based on the PCB production process consistent with the present disclosure.
Figure 3:
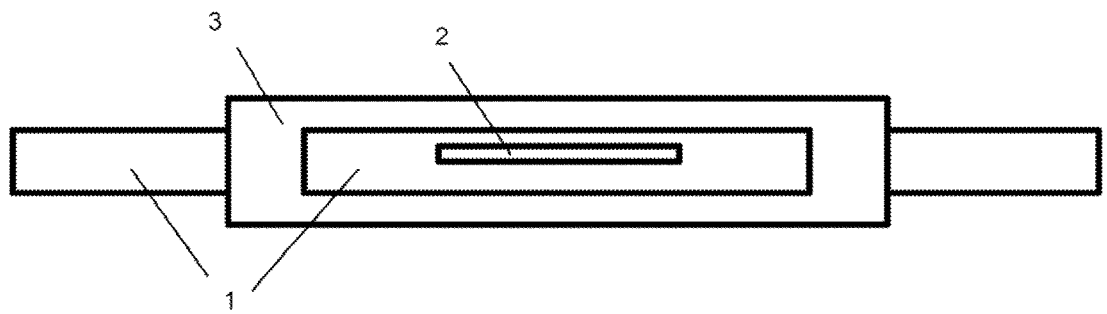
FIG. 3 is a block diagram illustrating a cross-sectional view of the exemplary integrated magnetic component shown in FIG. 1.
Figure 4:
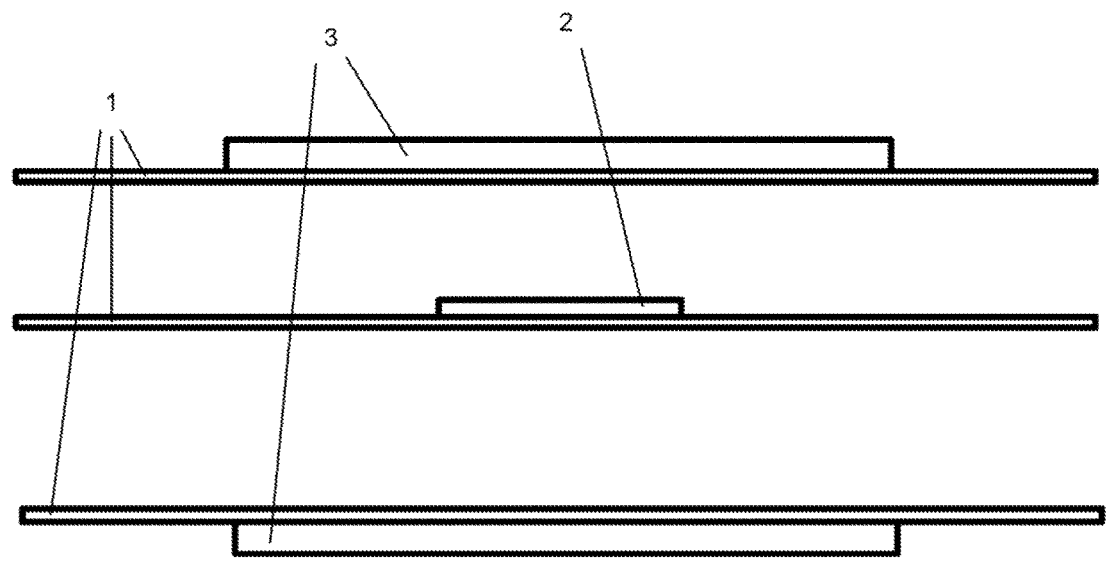
FIG. 4 is a block diagram illustrating an explosive cross-sectional view of the exemplary integrated magnetic component shown in FIG. 1.

As shown in FIG. 1, FIG. 3, and FIG. 4, an integrated magnetic component 5 consistent with the present disclosure includes a PCB baseboard 1, a magnetic core 2, a copper coil 3, and pins 4. The magnetic core 2, copper coil 3, and pins 4 are embedded in the baseboard 1. Further, the magnetic core 2 may be an iron or cobalt-based nanocrystalline film but not limited to, which may be stuck to or coated on the inner layer of the PCB baseboard 1. The copper coil 3 may be a thin copper foil.

Below is an exemplary method for manufacturing integrated magnetic components consistent with the present disclosure. The method includes the following steps.

Step 1. Cutting, which includes cutting the material of the PCB baseboard 1 to the size of the integrated magnetic component;

Step 2, Generating an iron-based nanocrystalline strip 2 using a soft magnetic thin film deposition method, or a melt spinning method, and then sticking or coating it on the inner layer of the PCB baseboard;

Step 3. Formulating the patterns on the inner side of magnetic core 2 using either a dry etching or a wet etching method; compressing multiple boards;

Step 4. Drilling holes on the PCB board for connecting different layers;

Step 5. Copper depositing and pattern transferring, interconnecting the inner and outer PCB board layer; depositing a layer of copper on the inner side of the drilled holes; and Step 6. Chemical plating and etching.

Consistent with the present disclosure, the integrated magnetic components may be used as a substrate or the baseboard of an LED power supply. Through the assembly process, an LED power supply may be integrated onto a miniaturized PCB, which may reduce the area occupied by the LED power supply. This helps to reduce the size and fully integrate the LED power supply.

Figure 2:
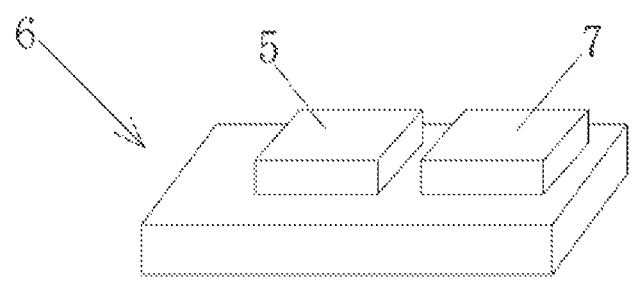
FIG. 2 is a block diagram illustrating an exemplary integrated LED power supply component consistent with the present disclosure.

In embodiments consistent with the present disclosure, the integrated magnetic component may be an inductor, a transformer, or a sensor. Moreover, as shown in FIG. 2, the integrated LED power supply 6 includes an integrated magnetic component 5, and other components for the power supply 7. The integrated magnetic component 5 may work as a substrate.

Consistent with the present disclosure, mathematical model for analysis of the integrated PCB (e.g., the LED power supply in FIG. 2) may be established using magnetic characteristic parameters of selected magnetic materials and a loss model of the embedded magnetic core. Using the mathematical model, electromagnetic properties and thermal properties of the power supply can be analyzed. The operating characteristics of the designed power supply using different structures can also be analyzed. In one embodiment, the design may optimize the integrated power supply by improving the capacity and reducing the size of the PCB design. Further, the process of the design optimization may take into considerations the functionality of a substrate of the magnetic component and the assembly process of the LED power supply.

Embodiments consistent with the present disclosure provides a LED power supply that is thin and small, highly integrated, and with manufacturing repeatability and reliability. Embodiments consistent with the present disclosure simplify the system assembly process, and save time and cost.

The embodiments disclosed herein are exemplary only. Other applications, advantages, alternations, modifications, or equivalents to the disclosed embodiments are obvious to those skilled in the art and are intended to be encompassed within the scope of the present disclosure.

INDUSTRIAL APPLICABILITY AND ADVANTAGEOUS EFFECTS

Without limiting the scope of any claim and/or the specification, examples of industrial applicability and certain advantageous effects of the disclosed embodiments are listed for illustrative purposes. Various alternations, modifications, or equivalents to the technical solutions of the disclosed embodiments can be obvious to those skilled in the art and can be included in this disclosure.

Embodiments of the present disclosure provide a method for making iron or cobalt-based magnetic thin films using a soft magnetic thin film deposition method, or a melt spinning method. Embodiments of the present disclosure further use the iron or cobalt-based magnetic thin films to make an embedded PCB magnetic core. Embodiments of the present disclosure thus provide thin and highly efficient magnetic components for LED power supplies. The magnetic components can further be used as a substrate in the assembly process. Embodiments of the present disclosure further use the integrated magnetic component as a substrate to manufacture a highly integrated LED power supply that is thin and small, and with manufacturing process repeatability and reliability.

What is claimed is:

1. A method for manufacturing an integrated magnetic component on a PCB for an LED power supply circuit, comprising:
    cutting a material of a PCB baseboard into a size of the integrated magnetic component;
    generating iron or cobalt-based soft magnetic thin films using a soft magnetic thin film deposition method or a melt spinning method;
    coating the soft magnetic thin films on the inner layer of the PCB baseboard to form a magnetic core;
    formulating a pattern on the magnetic core, using either a dry etching or a wet etching method;
    after formulating the pattern on the magnetic core, compressing multiple layers of the PCB baseboard;
    drilling holes on the PCB baseboard to connect different layers;
    inter-connecting an inner and outer PCB baseboard layer;
    depositing a layer of copper on an inner side of the holes; and
    plating and etching the PCB.

2. The method for manufacturing an integrated magnetic component for the LED power supply circuit according to claim 1, further comprising:
    assembling other components for the LED power supply circuit onto the integrated magnetic component using the integrated magnetic component as a substrate.

3. A method for manufacturing an integrated magnetic component on a PCB for an LED power supply circuit, comprising:
    cutting a material of a PCB baseboard into a size of the integrated magnetic component, wherein the PCB baseboard is a multi-layer PCB baseboard including at least one inner layer;
    generating iron or cobalt-based soft magnetic thin films using a soft magnetic thin film deposition method or a melt spinning method;
    coating the soft magnetic thin films on the outer layer of the PCB baseboard to form a magnetic core, the magnetic core being directly coated on the inner layer of the multi-layer PCB baseboard;
    formulating a pattern on the magnetic core, using either a dry etching or a wet etching method;
    after formulating the pattern on the magnetic core, compressing multiple layers of the PCB baseboard;
    drilling holes on the PCB baseboard to connect different layers of the multi-layer PCB baseboard;
    inter-connecting the inner layer and at least one outer layer of the multi-layer PCB baseboard;
    depositing a layer of copper on an inner side of the holes; and
    plating and etching the PCB.

* * * * *